(12) United States Patent
Tomobe et al.

(10) Patent No.: US 6,198,334 B1
(45) Date of Patent: Mar. 6, 2001

(54) CMOS CIRCUIT

(75) Inventors: Koichi Tomobe; Masaru Sugai; Hiroyuki Kida; Masahiro Tsuchiya, all of Hitachi; Yuji Matsushita, Iwaki; Hideto Suzuki, Kitaibaraki, all of (JP)

(73) Assignees: Hitachi, Ltd., Tokyo; Hitachi Engineering Co., Ltd.; Hitachi Haramachi Electronics Co., Ltd., both of Ibaraki, all of (JP)

( * ) Notice: Subject to any disclaimer, the term of this patent is extended or adjusted under 35 U.S.C. 154(b) by 0 days.

(21) Appl. No.: 09/065,450

(22) Filed: Apr. 24, 1998

(30) Foreign Application Priority Data

Apr. 24, 1997 (JP) .................................................. 9-107059

(51) Int. Cl.$^7$ .................................................. H03K 17/16
(52) U.S. Cl. ........................... 327/391; 327/112; 327/281
(58) Field of Search .................................... 327/109, 112, 327/81, 83, 87, 437, 276, 278, 281, 391

(56) References Cited

U.S. PATENT DOCUMENTS

| | | | | |
|---|---|---|---|---|
| 4,972,162 | * | 11/1990 | Banu | 331/111 |
| 5,121,014 | * | 6/1992 | Huang | 307/605 |
| 5,623,221 | * | 4/1997 | Miyake | 327/108 |
| 5,646,563 | * | 7/1997 | Kuo | 327/157 |
| 5,781,045 | * | 7/1998 | Walia et al. | 327/108 |
| 5,825,215 | * | 10/1998 | Sugio et al. | 327/108 |
| 5,825,219 | * | 10/1998 | Tsai | 327/112 |

* cited by examiner

*Primary Examiner*—Terry D. Cunningham
*Assistant Examiner*—Quan Tra
(74) *Attorney, Agent, or Firm*—Antonelli, Terry, Stout & Kraus, LLP

(57) ABSTRACT

In a CMOS noise eliminating circuit, a plurality of PMOS transistors or NMOS transistors are connected in series so as to cause of switching speeds or switching timings of the PMOS transistors or the NMOS transistors, which are connected in series, to differ from each other, thereby improving the noise-resistant performance of a semiconductor integrated circuit.

3 Claims, 10 Drawing Sheets

FIG. 5

| INPUT TERMINAL 1 | INPUT TERMINAL 2 | OUTPUT TERMINAL 3 | REMARKS |
|---|---|---|---|
| LOW | LOW | HIGH | P1, P2-ON, P3, P4-ON<br>N1, N2-OFF, N3, N4-OFF |
| LOW | HIGH | HIGH | P1, P2-ON, P3, P4-OFF<br>N1, N2-OFF, N3, N4-ON |
| HIGH | LOW | HIGH | P1, P2-OFF, P3, P4-ON<br>N1, N2-ON, N3, N4-OFF |
| HIGH | HIGH | LOW | P1, P2-OFF, P3, P4-OFF<br>N1, N2-ON, N3, N4-ON |

FIG. 8(A)
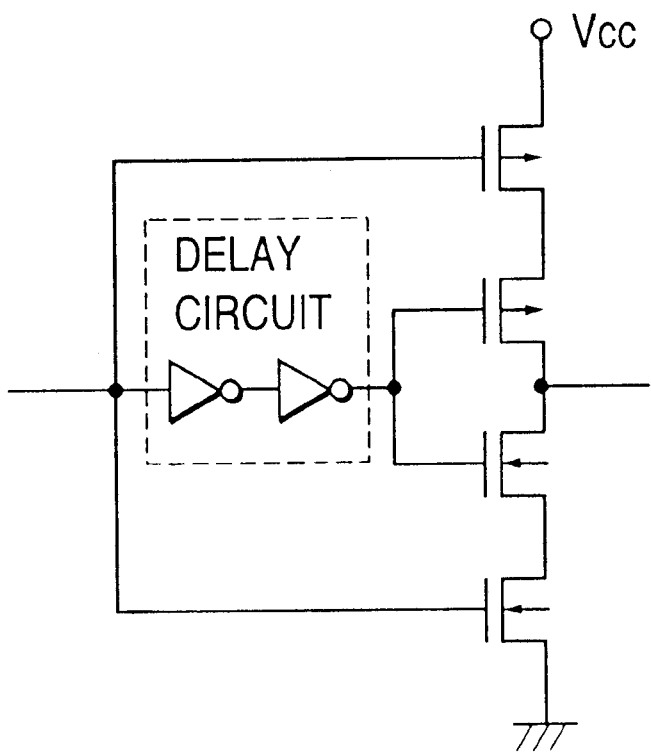
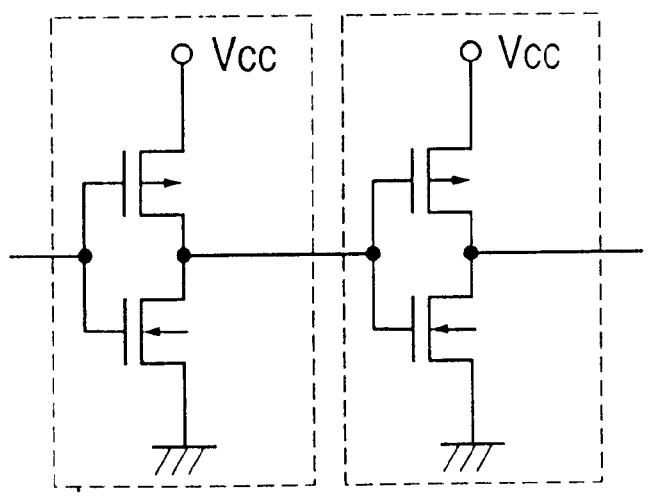
CONFIGURATION OF DELAY CIRCUIT
FIG. 8(B)

CMOS CIRCUIT

BACKGROUND OF THE INVENTION

The present invention relates to a noise eliminating CMOS circuit to be employed in a semiconductor integrated circuit.

FIG. 10(B) shows the standard symbol for an inverter circuit, which may be constituted by a CMOS integrated circuit. As shown in FIG. 10(A), the inverter circuit may be configured as follows. The gate of a PMOS transistor P1, the source of which is connected to a power supply voltage Vcc, and the gate of a NMOS transistor N1, the source of which is grounded, are each connected to a common input terminal. At the same time, the drain of the PMOS transistor P1 and that of the NMOS transistor N1 are each connected to a common output terminal. Depending on the voltage of an input signal inputted to the input terminal, the inverter circuit outputs an output signal at a "High" level or a "Low" level from the output terminal. Namely, when the input signal is higher than a logical threshold voltage VLT, the PMOS transistor P1 is in an OFF state and the NMOS transistor N1 is in an ON state, and thus the inverter circuit outputs a signal at a "Low" level from the output terminal. When the input signal is lower than the logical threshold voltage VLT, the PMOS transistor P1 is in an ON state and the NMOS transistor N1 is in an OFF state, and thus the inverter circuit outputs a signal at a "High" level from the output terminal.

When a noise is induced into the input signal, if a peak voltage of the noise does not attain the logical threshold voltage VLT, as represented by noise 1 or noise 3 in FIG. 11, neither the PMOS transistor P1, nor the NMOS transistor N1 performs a switching operation, and so the noise is not transmitted to the output signal. If, however, the peak voltage of the noise reaches or exceeds the logical threshold voltage VLT, as represented by noise 2 or 4 in FIG. 11, both the PMOS transistor P1 and the NMOS transistor N1 perform a switching operation, thus transmitting the noise to the output signal as represented by noise 5 or noise 6. The configuration of the inverter shown in FIG. 10(A) is described in "Hitachi LCD Controller/Driver LSI Data Book, 8th Edition".

Also, FIG. 12 shows the standard symbol for a Schmitt trigger circuit, i.e. one of the circuits which aim at eliminating noise and which have been employed in a semiconductor integrated circuit for this purpose. The circuit in FIG. 12 has a hysteresis characteristic in the input voltage, i.e. two logical threshold voltages, as will be described with reference to FIG. 13. When an input signal is higher than a first logical threshold voltage VIH, the circuit outputs a signal at a "Low" level from the output terminal, and when the input signal is lower than a second logical threshold voltage VIL, the circuit outputs a signal at a "High" level from the output terminal. In the operation of this circuit, there exists the relation that "the second logical threshold voltage VIL"<"the first logical threshold voltage VIM". When a noise is induced into the input signal, if a peak voltage of the noise does not attain the first logical threshold voltage VIH or the second logical threshold voltage VIL, as represented by noise 1 or noise 3 in FIG. 13, the noise is not transmitted to the output signal. If, however, the peak voltage of the noise attains the first logical threshold voltage VIH or the second logical threshold voltage VIL, as represented by noise 2 or 4 in FIG. 13, the noise is transmitted to the output as a noise 5 or noise 6. The Schmitt trigger circuit, compared with the circuit shown in FIG. 10(A), has a higher ability to eliminate noise, because the first logical threshold voltage VIH is nearer to Vcc than the logical threshold voltage VLT and the second logical threshold voltage VIL is nearer to GND than the logical threshold voltage VLT. Characteristics of the Schmitt trigger circuit are described in detail in, for example, "HD74LS14" in "Hitachi TTL Data Book HD74/74S/74LS/74AS/75/26/29 Series, 4th Edition", or "HD74HC14" in "Hitachi High Speed CMOS Logic Data Book".

In the above-described inverter, if the peak voltage of a noise component does not exceed the logical threshold voltage VLT, the noise is not transmitted to the output signal, but if the peak voltage of the noise component exceeds the logical threshold voltage VLT, the noise is transmitted to the output signal.

In the above-described Schmitt trigger circuit, if the peak voltage of noise component does not exceed the first logical threshold voltage VIH or the second logical threshold voltage VIL, depending on the level of the input signal, the noise is not transmitted to the output. If, however, the peak voltage of the noise exceeds the first logical threshold voltage VIH or the second logical threshold voltage VIL, the noise is transmitted to the output. This gives rise to the possibility of a malfunction or a false operation of the semiconductor integrated circuit.

If the first logical threshold voltage VIH in the Schmitt trigger circuit is set at a level nearer to the Vcc electric potential and, in addition the second logical threshold voltage VIL is set at a level nearer to the GND electric potential, the sensitivity for noise decreases. However, when the semiconductor integrated circuit equipped with such an input circuit is connected with an output of some other semiconductor integrated circuit, there arises a necessity for generating an output which is extremely close to the electric potential of Vcc or GND. A semiconductor integrated circuit with such an output characteristic is not so realistic or practical.

SUMMARY OF THE INVENTION

A CMOS circuit according to the present invention comprises a series circuit formed of a first MOS transistor and a second MOS transistor which are of a first conducting type, and at least one second conducting type MOS transistor connected to the second MOS transistor of first conducting tape in a series circuit; and, in addition, in the CMOS circuit, a circuit including the series circuit and the MOS transistor of second conducting type is connected between a power supply voltage and ground. The CMOS circuit further comprises a means for causing the switching speed or the switching timing of the first MOS transistor to differ from that of the second MOS transistor of first conducting type. Here, the conducting type of a MOS transistor is either a P-channel type or a N-channel type, and the first conducting type and the second conducting type are of the opposite conducting type to each other.

According to the present invention, the switching speeds or the switching timings of the first MOS transistor and the second MOS transistor, which are connected in series, are different from each other. This makes it difficult for the CMOS circuit to respond to a noise, thus enabling elimination of the noise.

An even more specific example of a CMOS circuit according to the present invention comprises a first PMOS transistor, a second PMOS transistor, a first NMOS transistor, and a second NMOS transistor. A drain of the second PMOS transistor and that of the second NMOS transistor are each connected to a common output terminal. The source of the second PMOS transistor is connected with the drain of the first PMOS transistor, and the source of the first PMOS transistor is connected with a power supply voltage. The source of the second NMOS transistor is connected with the drain of the first NMOS transistor, and the source of the first NMOS transistor is grounded. Namely, a series circuit of the first and the second PMOS transistors is connected in series with a series circuit of the first and the second NMOS transistors at the second PMOS transistor side and at the second NMOS transistor side. Furthermore, the CMOS circuit comprises a means for causing the switching speeds or switching timings of the first PMOS transistor and the first NMOS transistor to differ from those of the second PMOS transistor and the second NMOS transistor, respectively.

According to such a configuration, the switching speeds or switching timings of the first PMOS transistor and the second PMOS transistor, which are connected in series, are different from each other, and, at the same time, the switching speeds or switching timings of the first NMOS transistor and the second NMOS transistor are different from each other. This characteristic makes it possible to eliminate noise with a polarity, regardless of the kind of polarity, i.e. a positive or a negative polarity.

BRIEF DESCRIPTION OF THE DRAWINGS

FIG. 5 shows a truth table of the third embodiment of the CMOS noise eliminating circuit according to the present invention;

FIG. 8(A) is a circuit diagram showing a noise eliminating circuit of the second embodiment, and FIG. 8(B) is a circuit diagram showing an example of a delay circuit used therein;

DESCRIPTION OF PREFERRED EMBODIMENTS

First Embodiment

Figure 1:
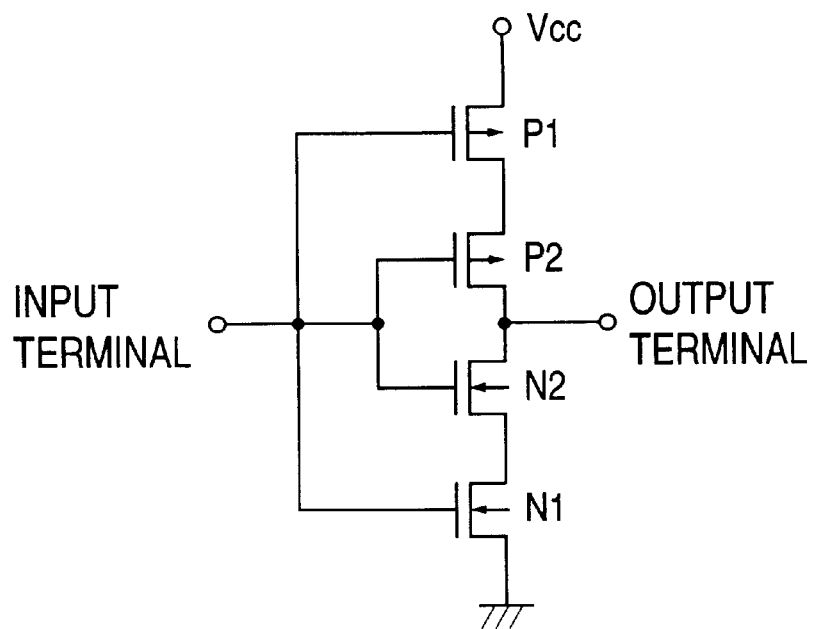
FIG. 1 is a circuit diagram showing a first embodiment of a CMOS noise eliminating circuit according to the present invention.

FIG. 1 is a circuit diagram showing a first embodiment of the present invention. In the FIG., the gate of a PMOS transistor P1, the gate of a NMOS transistor N1, the gate of a PMOS transistor P2, and the gate of a NMOS transistor N2 are each connected a common input terminal. The drain of the PMOS transistor P2 and that of the NMOS transistor N2 are each connected to a common output terminal. The source of the PMOS transistor P2 is connected with the drain of the PMOS transistor P1, and the source of the PMOS transistor P1 is connected to a power supply voltage Vcc. The source of the NMOS transistor N2 is connected with the drain of the NMOS transistor N1, and the source of the NMOS transistor N1 is grounded.

Not only between the PMOS transistor P2 and the PMOS transistor P2, but also between the NMOS transistor N1 and the NMOS transistor N2, the channel resistances or the gate threshold voltages are adjusted so as to cause a difference in switching speeds to occur between each of the MOS transistors themselves.

For example, the ratio L/W of the gate length L to the gate width W in the PMOS transistor P2 is made greater than the ratio L/W in the PMOS transistor P1 so as to make the channel resistance of the PMOS transistor P2 higher than that of the PMOS transistor P1. This makes it possible to cause the switching speed of the PMOS transistor P2 to be delayed relative to that of the PMOS transistor P1. Similarly, it is possible to cause the switching speed of the NMOS transistor N2 to be delayed relative to that of the NMOS transistor N1. Also, in order to adjust the gate threshold voltage, impurity ions are implanted into a channel region in a MOS transistor. If the ion implantation quantity is made larger in the PMOS transistor P2 than in the PMOS transistor P1, the gate threshold voltage becomes higher in the PMOS transistor P2, thus making it possible to cause the switching speed of the PMOS transistor P2 to be delayed relative to that of the PMOS transistor P1. Similarly, it is possible to cause the switching speed of the NMOS transistor N2 to be delayed relative to that of the NMOS transistor N1. Incidentally, it is also possible to make the gate threshold voltage of the PMOS transistor P2 higher than that of the PMOS transistor P1 by making the gate oxide film thickness of the PMOS transistor P2 greater than that of the PMOS transistor P1. Moreover, it is also possible to cause the switching speed of the PMOS transistor P2 to be delayed relative to that of the PMOS transistor P1 by making the CR time constant, which is determined by the gate capacity and the gate resistance, which are longer in the PMOS transistor P2 than in the PMOS transistor P1. similarly, it is possible to cause the switching speed of the NMOS transistor N2 to be delayed relative to that of the NMOS transistor N1. At the time of changing the gate capacity, the gate oxide films of the PMOS transistor P2 and the NMOS transistor N2 are each made thinner than those of the PMOS transistor P1 and the NMOS transistor N1, or the areas of the MOS gates of the PMOS transistor P2 and the NMOS transistor N2 are each made larger than those of the PMOS transistor P1 and the NMOS transistor N1. Namely, the gate capacities of the PMOS transistor P2 and the NMOS transistor N2 are each made greater than those of the PMOS transistor P1 and the NMOS transistor N1. Also, at the time of changing the gate resistance, the ratios 1/w of a length 1 to the width w of the gate wirings, which extend from a common gate wiring unit to each of the cells, i.e. the PMOS transistor P2 and the NMOS transistor N2, are each made greater than the ratios 1/w in the case of the PMOS transistor P1 and the NMOS transistor N1. Namely, the gate wiring resistances of the PMOS transistor P2 and the NMOS transistor N2 are each made higher than those of the PMOS transistor P1 and the NMOS transistor N1.

Also, it is possible to change the ratio resistances without changing the ratios 1/w of the gate wirings. Namely, the ratio resistances of the gate wirings in the PMOS transistor P2 and the NMOS transistor N2 are each made higher than those in the PMOS transistor P1 and the NMOS transistor N1. For changing the ratio resistances, various methods may be employed, such as changing the material of the gate wirings, changing the doping quantity of an impurity (for example, phosphorus) into a polysilicon gate wiring, or forming a metal silicide on the surface of a polysilicon gate, the ratio resistance of which is to be made lower. Additionally, concerning the above-mentioned various means for changing the switching speeds, a plurality of means may be employed in combination.

A case in which the switching speeds of the PMOS transistor P1 and the NMOS transistor N1 are faster by Td than those of the PMOS transistor P2 and the NMOS transistor N2 will be considered. When the present circuit is operated normally without noise, for example, when a "Low" level is inputted to the input terminal and the circuit is stabilized, the PMOS transistor P1 and the PMOS transistor P2 are switched on and the NMOS transistor N1 and the NMOS transistor N2 are switched off, and thus a "High" level is outputted from the output terminal. Also, when a "High" level is inputted to the input terminal and the circuit is stabilized, the PMOS transistor P1 and the PMOS transistor P2 are switched off and the NMOS transistor N1 and the NMOS transistor N2 are switched on, and thus a "Low" level is outputted from the output terminal. This is the basic function of the inverter circuit.

Figure 2:
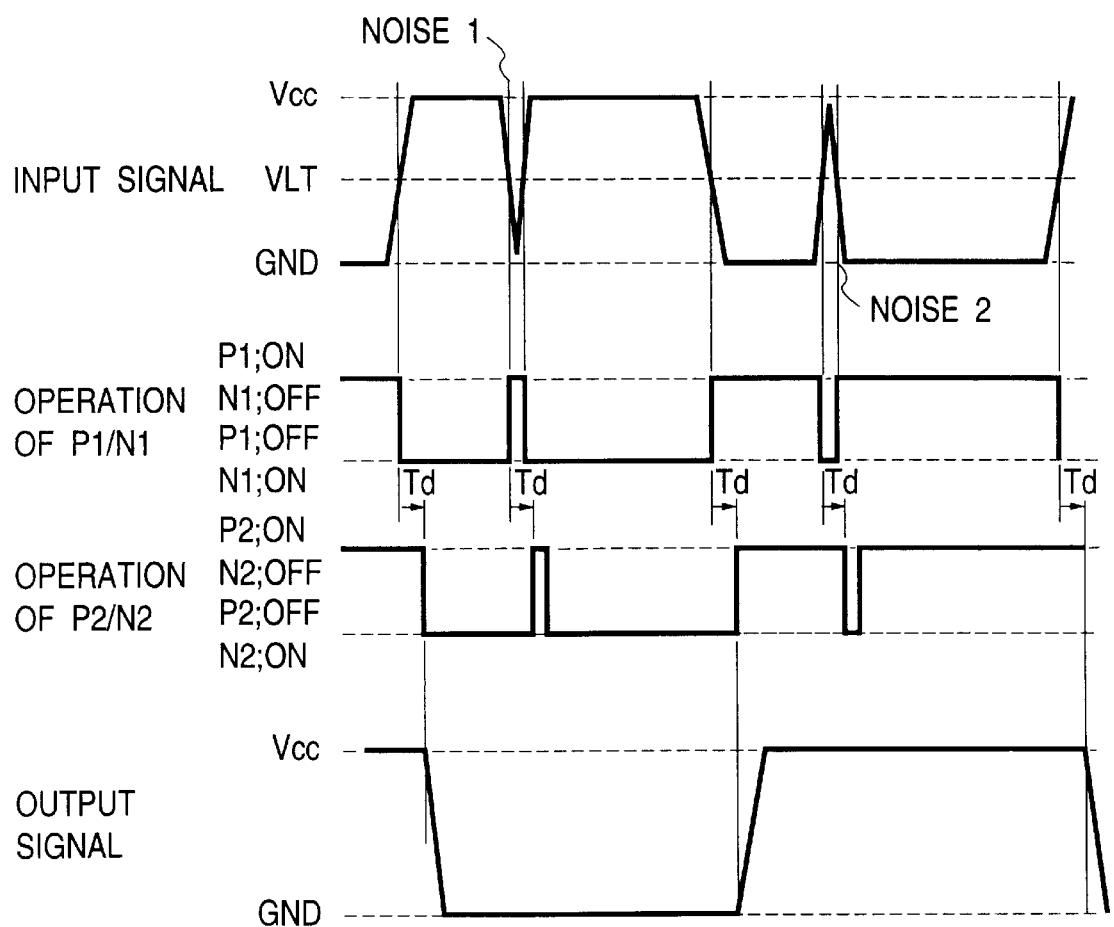
FIG. 2 is a waveform diagram for describing operations of the first and a second embodiments of the CMOS noise eliminating circuit according to the present invention.

FIG. 2 shows an input signal, an output signal and a switching operation of each transistor at a time when a noise is inputted to the input terminal. When a noise 1 is inputted, the NMOS transistor N1 is switched off first, and then with a delay of Td, the NMOS transistor N2 is switched off. Also, the PMOS transistor P1 is switched on first, and then with a delay of Td, the PMOS transistor P2 is switched on. At this time, the PMOS transistor P1 and the PMOS transistor P2 are not switched on at the same time. On account of this, the output terminal is not connected with a power supply voltage Vcc and thus the voltage at the output terminal does not become equal to the power supply voltage Vcc. Namely, since the state wherein "the PMOS transistor P1 is on and the NMOS transistor N1 is off" and the state wherein "the PMOS transistor P2 is on and the NMOS transistor N2 is off" do not occur at the same time, the output terminal is not connected with the power supply voltage Vcc and thus the noise 1 is not transmitted to the output terminal.

Similarly, when a noise 2 is inputted, the NMOS transistor N1 is switched on first, and then with a delay of Td, the NMOS transistor N2 is switched on. Also, the PMOS transistor P1 is switched off first, and then with a delay of Td, the PMOS transistor P2 is switched off. At this time, the NMOS transistor N1 and the NMOS transistor N2 are not switched on at the same time. On account of this, the output terminal is not connected with ground electric potential GND, and thus the voltage at the output terminal does not become equal to the ground electric potential GND. Namely, since the state wherein "the PMOS transistor P1 is off and the NMOS transistor N1 is on" and the state wherein "the PMOS transistor P2 is off and the NMOS transistor N2 is on" do not occur at the same time, the output terminal is not connected with the ground electric potential GND, and thus the noise 2 is not transmitted to the output terminal. In this way, even if a noise exceeding the logical threshold voltage is inputted to the circuit of the present embodiment, it is possible to eliminate the noise by causing a difference in switching speeds to occur between each of the MOS transistors.

Moreover, according to the present embodiment, there is no need for externally attaching an external noise eliminating circuit such as a filter circuit, to an input unit of a semiconductor integrated circuit. This makes it possible to improve the noise-resistant performance of the device to which the invention is applied without enlarging the size of the device. Also, the feature of the present embodiment, by which the MOS transistors themselves are furnished, does not require an increase in the number of circuit elements, such as a switching device, in comparison with use of a signal delay circuit, as will be described below. Accordingly, an application of the present embodiment to a semiconductor integrated circuit makes it possible to embody a noise-proof semiconductor integrated circuit without enlarging the semiconductor chip size.

In the present embodiment, the switching speeds of the PMOS transistor P2 and the NMOS transistor N2 at an inner side of the series circuit are each caused to be delayed relative to those of the PMOS transistor P1 and the NMOS transistor N1 at an outer side of the series circuit. Conversely, it is possible for the switching speeds of the PMOS transistor P1 and the NMOS transistor N1 at the outer side to be delayed. Incidentally, in the case of the embodiment in FIG. 1, although the output becomes equal to a floating electric potential during the delay time, the electric potential at the connection point of P1 and P2 becomes Vcc and the electric potential at the connection point of N1 and N2 becomes GND, thus enabling a more stable elimination of the noise.

Second Embodiment

Figure 3:
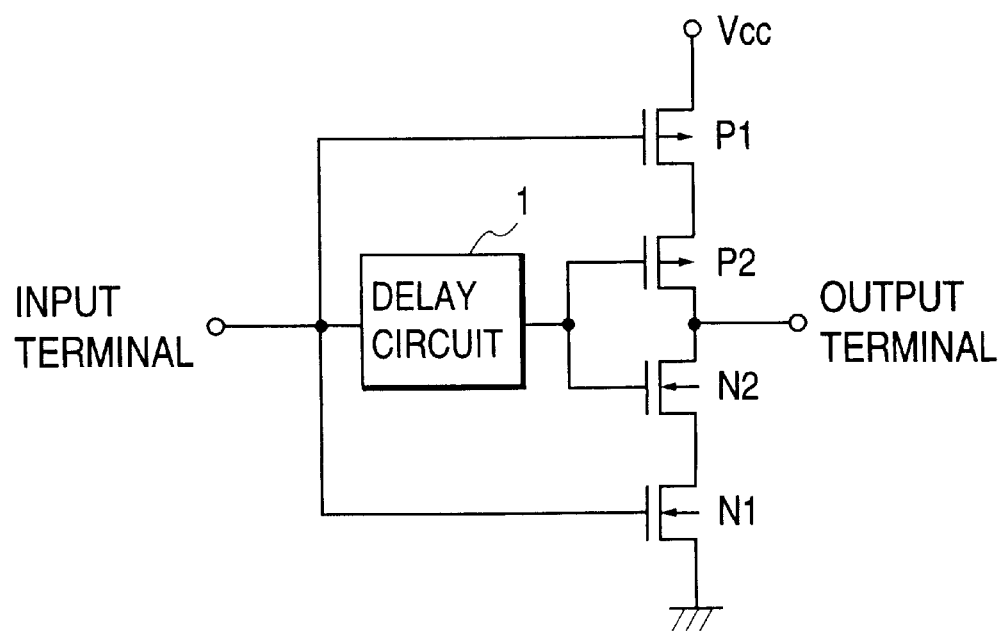
FIG. 3 is a circuit diagram showing a second embodiment of the CMOS noise eliminating circuit according to the present invention.

FIG. 3 is a circuit diagram showing a second embodiment of the present invention. In this embodiment, instead of causing a difference in the switching speeds to occur between each of the MOS transistors themselves, as is the case with the first embodiment, the features of the present invention may be attained by causing a difference in the switching timings to occur between gate input signals in each of the MOS transistors. In FIG. 3, the gate of a PMOS transistor P1, the gate of a NMOS transistor N1, and the input of a delay circuit 1 are each connected to an input terminal. The gate of a PMOS transistor P2 and that of a NMOS transistor N2 are each connected to the output of the delay circuit 1. The drain of the PMOS transistor P2 and that of the NMOS transistor N2 are each connected to an output terminal. The source of the PMOS transistor P2 is connected with the drain of the PMOS transistor P1, and the source of the PMOS transistor P1 is connected to a power supply voltage Vcc. The source of the NMOS transistor N2 is connected with the drain of the NMOS transistor N1, and the source of the NMOS transistor N1 is grounded. Also, the delay circuit 1 is configured to cause switching timings of the PMOS transistor P2 and the NMOS transistor N2 to be delayed by Td relative to those of the PMOS transistor P1 and the NMOS transistor N1.

When an input signal is inputted to the input terminal, the delay circuit 1 causes a difference to occur between the time needed for the input signal to reach the PMOS transistor P1 and the NMOS transistor N1 and the time needed for the input signal to reach the PMOS transistor P2 and the NMOS transistor N2. This makes it possible to obtain the same effect as that in the first embodiment. Consequently, it is possible to also describe the operation of the present embodiment using FIG. 2. However, such description of the operation in FIG. 2 will be omitted since it is the same as that in the first embodiment.

Also, the above-mentioned delay circuit can be embodied by connecting CMOS inverters, as shown in FIG. 8(A) in an even number of steps in cascade. Otherwise, it is possible to form the delay circuit using resistors and capacitors.

Additionally, in order to obtain a desired delay time Td, it is possible to use a means of employing a delay circuit, such as the present embodiment, together with a means based on an element configuration itself, such as provided by the first embodiment in FIG. 1. Such a use of means in combination, even if there are a variety of restrictions and limits on the layout of an integrated circuit or the manufacturing processes, makes it possible to comparatively enlarge the degree of freedom at which Td can be set.

Third Embodiment

Figure 4A:
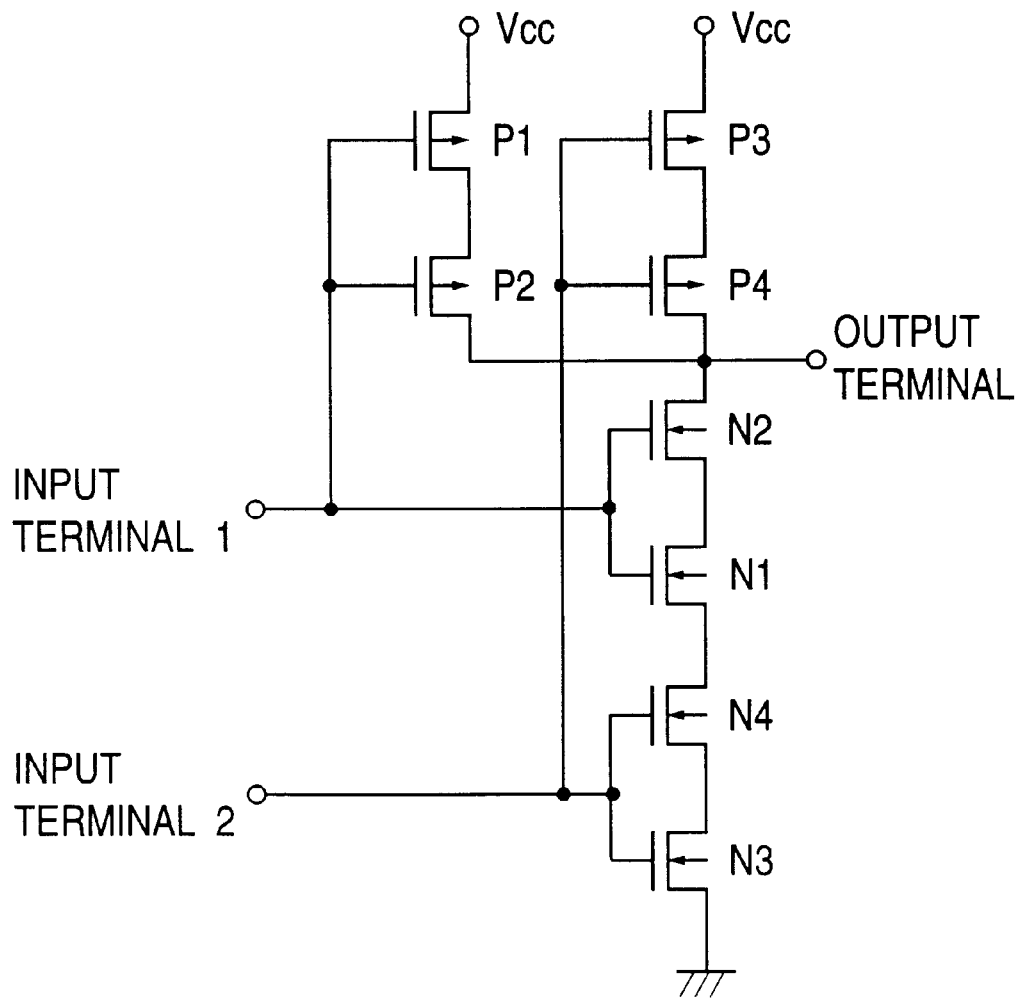
FIG. 4(A) is a circuit diagram showing a third embodiment of the CMOS noise eliminating circuit according to the present invention.
Figure 4B:
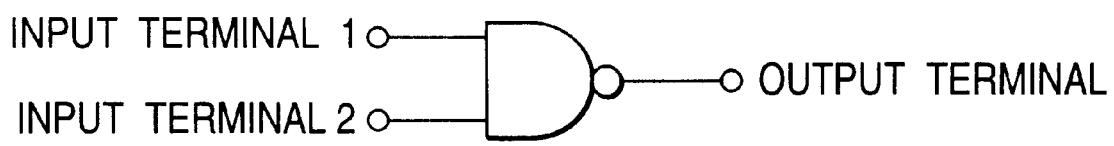
FIG. 4(B) shows a standard symbol for this circuit.

FIG. 4(A) is a circuit diagram showing a third embodiment in which the present invention has been applied to a 2-input NAND logical gate, the standard symbol for which is shown in FIG. 4(B). In FIG. 4(A), the gate of a PMOS transistor P1, the gate of a NMOS transistor N1, the gate of a PMOS transistor P2, and the gate of a NMOS transistor N2 are each connected to an input terminal 1. The drain of the PMOS transistor P2 and that of the NMOS transistor N2 are each connected to an output terminal. The source of the PMOS transistor P2 is connected with the drain of the PMOS transistor P1, and the source of the PMOS transistor P1 is connected to a power supply voltage Vcc. The source of the NMOS transistor N2 is connected with the drain of the NMOS transistor N1, and the source of the NMOS transistor N1 is connected with the drain of a NMOS transistor N4. Meanwhile, the gate of a PMOS transistor P3, the gate of a NMOS transistor N3, the gate of a PMOS transistor P4, and the gate of the NMOS transistor N4 are each connected to an input terminal 2. A drain of the PMOS transistor P4 is connected to the output terminal, the source of the PMOS transistor P4 is connected with the drain of the PMOS transistor P3, and the source of the PMOS transistor P3 is connected to a power supply voltage Vcc. The source of the NMOS transistor N4 is connected with the drain of the NMOS transistor N3, and the source of the NMOS transistor N3 is connected to ground electric potential GND.

Between the PMOS transistor P1 and the PMOS transistor P2, between the PMOS transistor P3 and the PMOS transistor P4, between the NMOS transistor N1 and the NMOS transistor N2, and between the NMOS transistor N3 and the NMOS transistor N4, the gate widths, the gate lengths, and the ion implantation quantity are adjusted so as to cause a difference in the switching speeds. In the present embodiment, it is assumed that the switching speeds of the PMOS transistor P1, the PMOS transistor P3, the NMOS transistor N1 and the NMOS transistor N3 are faster by Td than those of the PMOS transistor P2, the PMOS transistor P4, the NMOS transistor N2 and the NMOS transistor N4.

Figure 6:
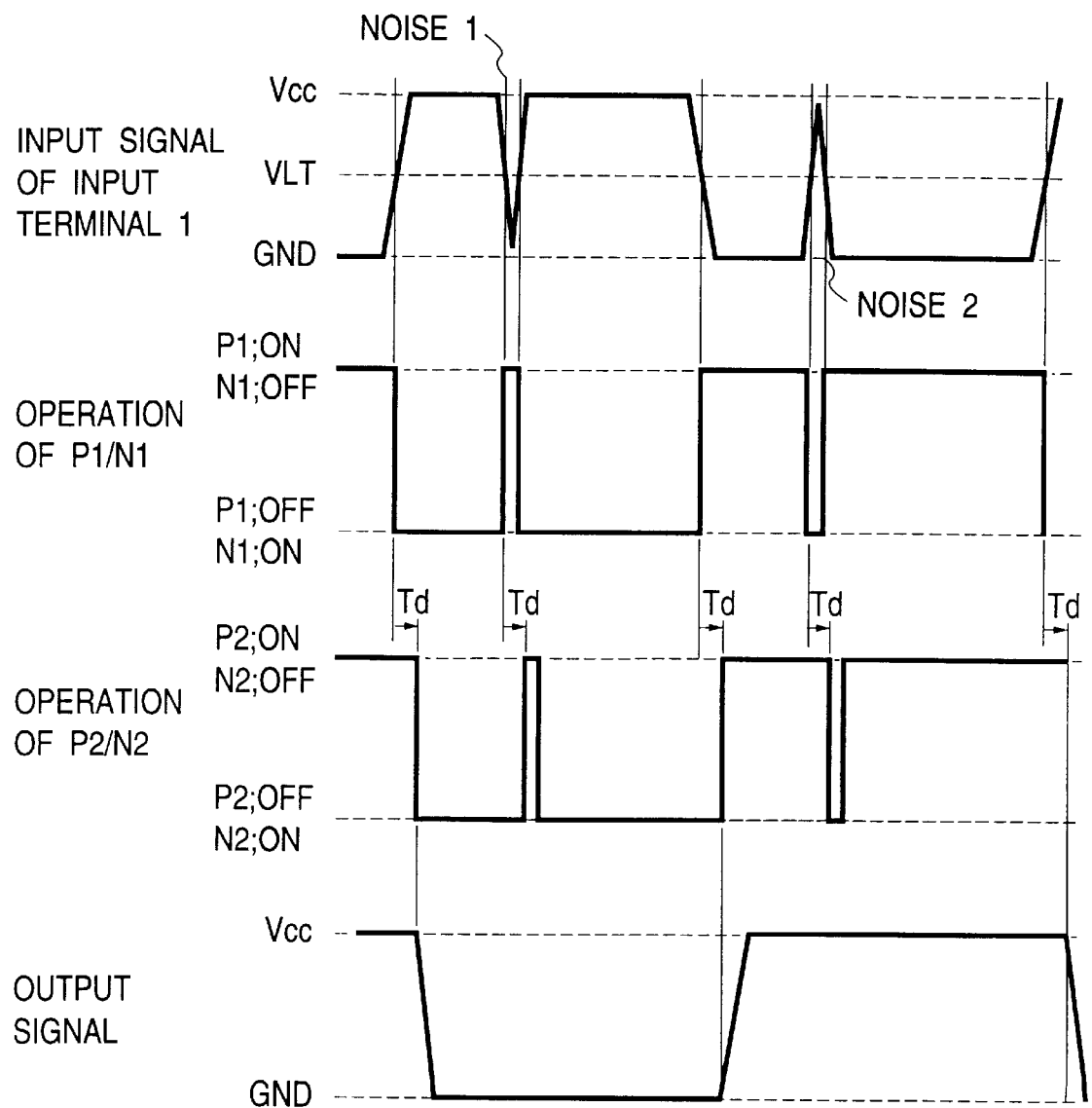
FIG. 6 is a waveform diagram for describing operations of the third embodiment and a fourth embodiment of the CMOS noise eliminating circuit according to the present invention.

When the present circuit is in a state of being operated normally without noise, each of the MOS transistors carry out an operation as described under Remarks in the truth table shown in FIG. 5, thus performing the function of a 2-input NAND logical gate. Considered here as an example is a case in which the "High" level has been inputted to the input terminal 2 and the state thereof is assumed to be unchanged, and a noise has been inputted to the input terminal 1. Since the "High" level has been inputted to the input terminal 2, the PMOS transistor P3 and the PMOS transistor P4 are always off and the NMOS transistor N3 and the NMOS transistor N4 are always on. FIG. 6 shows an input signal, an output signal and the operation of each of the MOS transistors when, at this time, noise is inputted to the input terminal 1. When a noise 1 is inputted, the NMOS transistor N1 is switched off first, and then with a delay of Td, the NMOS transistor N2 is switched off. Also, the PMOS transistor P1 is switched off first, and then with a delay of Td, the PMOS transistor P2 is switched off. Thus, the PMOS transistor P1 and the PMOS transistor P2 are not switched on at the same time. On account of this, the output terminal is not connected with the power supply voltage Vcc, and thus the voltage at the output terminal does not become equal to the power supply voltage Vcc. Namely, since a state wherein "the PMOS transistor P1 is on and the NMOS transistor N1 is off" and a state wherein "the PMOS transistor P2 is on and the NMOS transistor N2 is off" do not occur at the same time, the output terminal is not connected with the power supply voltage Vcc and thus the noise 1 is not transmitted to the output terminal.

On the other hand, when a noise 2 is inputted, the NMOS transistor N1 is switched on first, and then with a delay of Td, the NMOS transistor N2 is switched on. Also, the PMOS transistor P1 is switched off first, and then with a delay of Td, the PMOS transistor P2 is switched off. Thus, the NMOS transistor N1 and the NMOS transistor N2 are not switched on at the same time. On account of this, the output terminal is not connected with ground electric potential GND, and thus the voltage at the output terminal does not become equal to the ground electric potential GND. Namely, since a state wherein "the PMOS transistor P1 is off and the NMOS transistor N1 is on" and a state wherein "the PMOS transistor P2 is off and the NMOS transistor N2 is on" do not occur at the same time, the output terminal is not connected with the ground electric potential GND, and thus the noise 2 is not transmitted to the output terminal.

Consideration will now be given, as an example, to a case in which, conversely, a "Low" level has been inputted to the input terminal 2 and the state thereof is assumed to be unchanged, and a noise has been inputted to the input terminal 1. At this time, since the "Low" level has been inputted to the input terminal 2, the PMOS transistor P3 and the PMOS transistor P4 are always on, and the NMOS transistor N3 and the NMOS transistor N4 are always off, the output terminal outputs a "High" level regardless of the state of the input signal at the input terminal 1. A further example is a case in which a terminal at which an input level is fixed and a terminal into which noise is inputted are reversed with each respect to other, i.e. the "High" level is inputted to the input terminal 1 and the state thereof is assumed to be unchanged, and a noise has been inputted to the input terminal 2. In this case, since the PMOS transistor P3, the NMOS transistor N3, the PMOS transistor P4 and the NMOS transistor N4 each perform the same operations as the above-mentioned operations of the PMOS transistor P3, the NMOS transistor N3, the PMOS transistor P2, and the NMOS transistor N2, the noise is not transmitted to the output terminal. In this way, it is possible to eliminate noise exceeding the logical threshold voltage by causing a difference in the switching speeds to occur between each of the MOS transistors.

Fourth Embodiment

Figure 7:
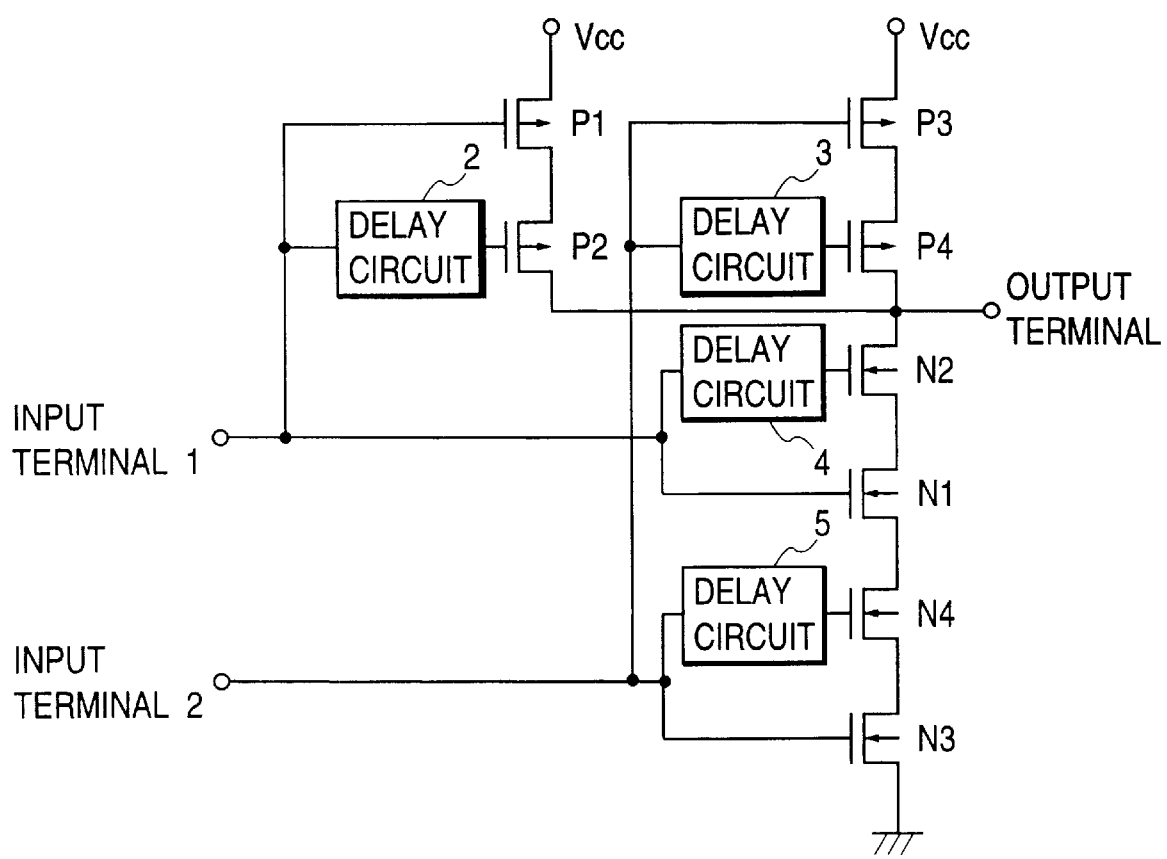
FIG. 7 is a circuit diagram showing a fourth embodiment of the CMOS noise eliminating circuit according to the present invention.

FIG. 7 is a circuit diagram showing a fourth embodiment of the present invention. In this embodiment, instead of causing a difference in the switching speeds to occur between each of the MOS transistors themselves, a 2-input NAND logical gate has been formed by causing a difference in the switching timings to occur between gate input signals in each of the MOS transistors. In FIG. 7, the gate of a PMOS transistor P1, the gate of a NMOS transistor N1, the input of a delay circuit 2, and the input of a delay circuit 4 are each connected to an input terminal 1. The output of the delay circuit 4 is connected with the gate of a NMOS transistor N2, and the output of the delay circuit 2 is connected with the gate of a PMOS transistor P2. The drain of the PMOS transistor P2, the drain of the PMOS transistor P4, and the drain of the NMOS transistor N2 are each connected to an output terminal. The source of the PMOS transistor P2 is connected with the drain of the PMOS transistor P1, and the source of the PMOS transistor P1 is connected to a power supply voltage Vcc. The source of the NMOS transistor N2 is connected with the drain of the NMOS transistor N1, and the source of the NMOS transistor N1 is connected with the drain of the NMOS transistor N4. Meanwhile, the gate of a PMOS transistor P3, the gate of a NMOS transistor N3, the input of a delay circuit 3, and the input of a delay circuit 5 are each connected to an input terminal 2. The output of the delay circuit 5 is connected with a gate of the NMOS transistor N4, and the output of the delay circuit 3 is connected with the gate of the PMOS transistor P4. The source of the PMOS transistor P4 is connected with the drain of the PMOS transistor P3, and the source of the PMOS transistor P3 is connected to a power supply voltage Vcc. The source of the NMOS transistor N4 is connected with the drain of the NMOS transistor N3, and the source of the NMOS transistor N3 is grounded.

The delay circuit 2, the delay circuit 3, the delay circuit 4, and the delay circuit 5 cause a delay time Td to be produced for an input signal and an output signal. Accordingly, the delay circuit 2, the delay circuit 3, the delay circuit 4, and the delay circuit 5 allow a difference Td in the switching timings to occur between the PMOS transistor P1 and the PMOS transistor P2, between the PMOS transistor P3 and the PMOS transistor P4, between the NMOS transistor N1 and the NMOS transistor N2, and between the NMOS transistor N3 and the NMOS transistor N4, respectively. This makes it possible to obtain the same effect as that in the third embodiment and to attain noise elimination as illustrated in FIG. 6. A description of the operation in FIG. 6 will be omitted, since it is the same as that in the third embodiment.

Incidentally, in the present embodiment, although the delay circuit 2 connected with the gate of the PMOS transistor P2 and the delay circuit 4 connected with the gate of the NMOS transistor N2 are provided independently of each other, even if only one delay circuit is provided, the object of the present invention remains the same and the delay circuit can be constituted in common. Also, concerning the delay circuit 3 and the delay circuit 5, they also may be replaced by only one delay circuit.

Fifth Embodiment

Figure 9A:
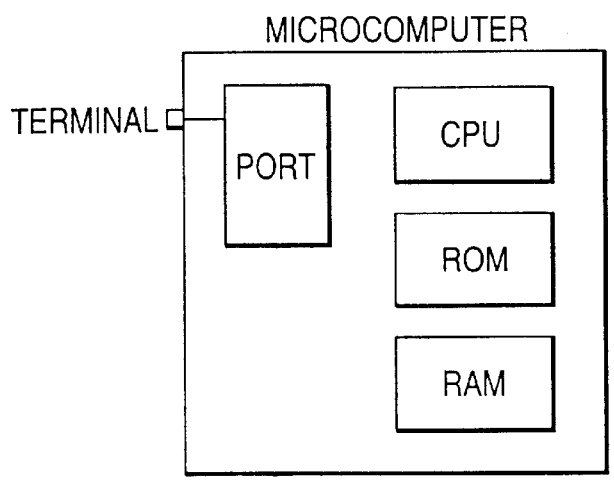
FIG. 9(A) is a block diagram of a microcomputer.
Figure 9B:
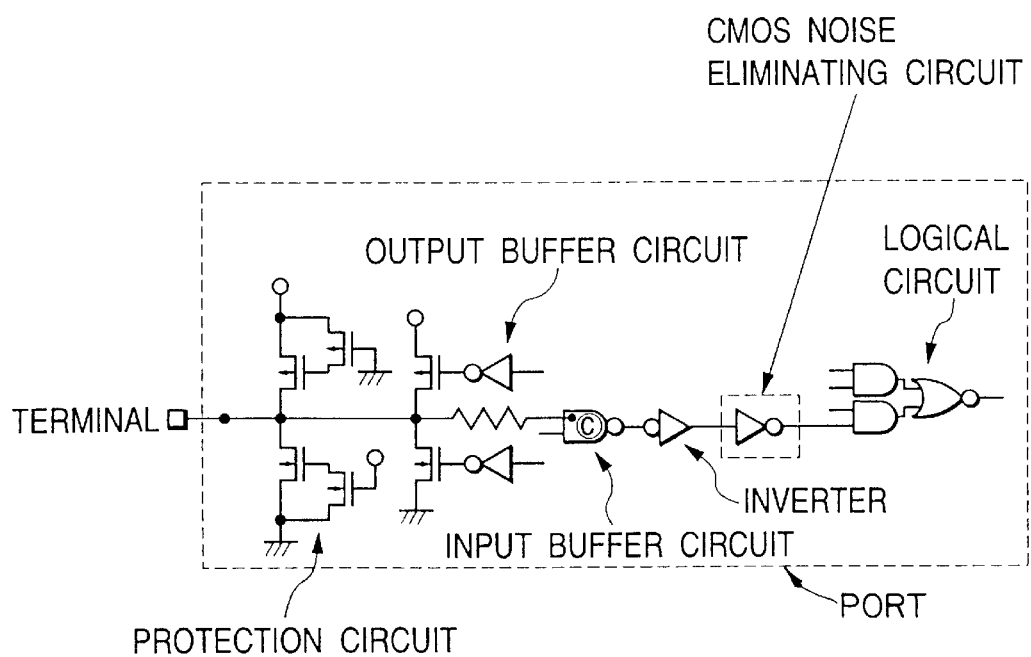
FIG. 9(B) is a circuit diagram showing a semiconductor integrated circuit forming the PORT in the microcomputer and including a CMOS noise eliminating circuit of the present invention.
Figure 10A:
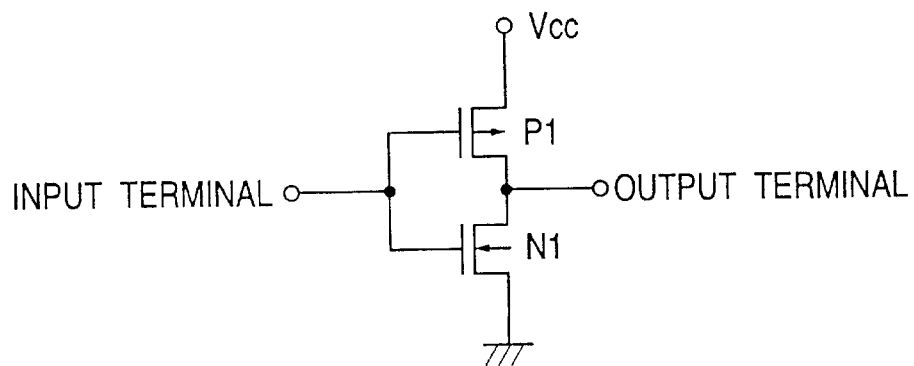
FIG. 10(A) is a circuit diagram showing an example of prior CMOS circuits.
Figure 10B:
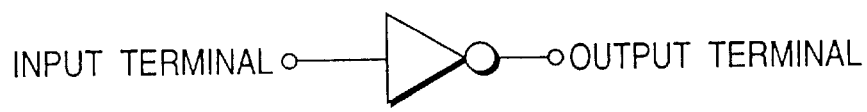
FIG. 10(B) shows a standard symbol for an invertor.
Figure 11:
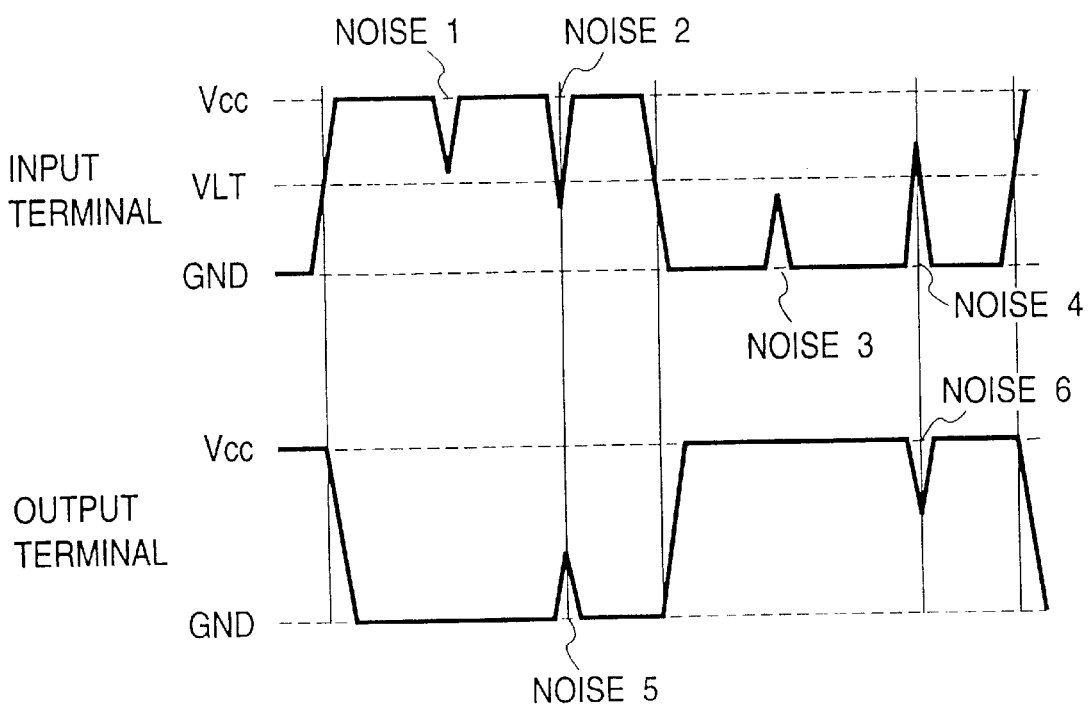
FIG. 11 is a waveform diagram for describing an operation of the circuit in FIG. 10(A)
Figure 12:
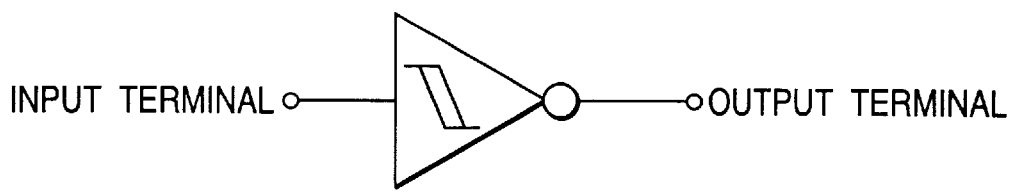
FIG. 12 shows the standard symbol for a Schmitt trigger circuit.
Figure 13:
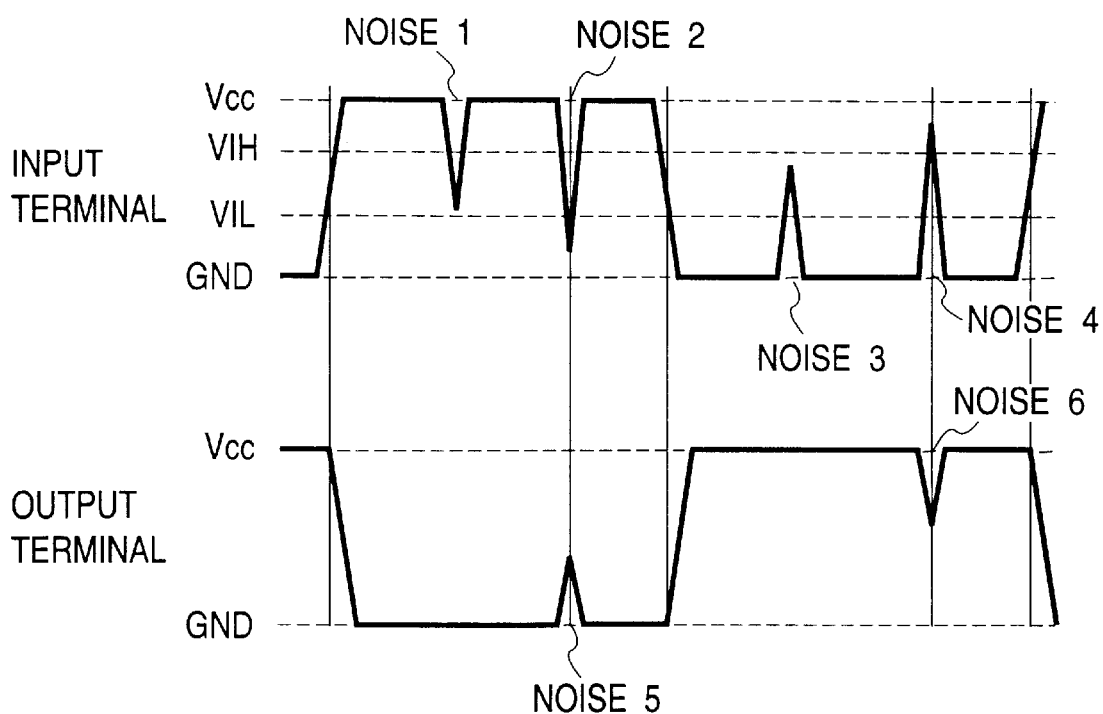
FIG. 13 is a waveform diagram for describing an operation of a Schmitt trigger circuit.

FIG. 9(A) is a block diagram showing an example of a semiconductor integrated circuit in which the CMOS circuit embodying the present invention is employed. The semiconductor integrated circuit based on the present embodiment is a microcomputer comprising an arithmetic processing unit, i.e. a CPU, and memory units, such as a ROM or a RAM. Employed at the input port unit thereof is the CMOS circuit according to the present invention, and details of the input port unit are as illustrated in FIG. 9(B). Connected with an input terminal are a protection circuit, an output buffer circuit, and an input buffer circuit, and connected with the input buffer circuit is an inverter circuit for logic adjustment. The CMOS circuit according to the present invention is connected between the inverter circuit and a plurality of logical circuits for performing a processing on a signal so as to eliminate noise in an input signal. The present embodiment provides a CMOS circuit in which a delay circuit, such as the embodiment of FIG. 3 is used. Additionally, the CMOS circuits in the other embodiments are also applicable. According to the present embodiment, the CMOS circuit embodying the present invention eliminates noise before an input signal has been distributed into a plurality of logical circuits. This makes it possible to embody a microcomputer which is not likely to exhibit a malfunction or carry out a false operation under conditions of a comparatively loud noise being inputted. Incidentally, the CMOS circuit according to the present invention, which is not limited to the present embodiment, is applicable to other semiconductor integrated circuits, too.

In accordance with the present invention, even if a comparatively loud noise is inputted into a semiconductor integrated circuit, an elimination of the noise is carried out, thus making it possible to embody a semiconductor integrated circuit which is noise-resistant and thus has a high reliability.

What is claimed is:

1. A CMOS circuit comprising:

a first PMOS transistor;

a second PMOS transistor;

a first NMOS transistor;

a second NMOS transistor;

a drain of said second PMOS transistor and a drain of said second NMOS transistor being each connected with a common output terminal, a source of said second PMOS transistor being connected with a drain of said first PMOS transistor.

a source of said first PMOS transistor being connected with a power supply voltage, a source of said second NMOS transistor being connected with a drain of said first NMOS transistor, a source of said first NMOS transistor being grounded, and means for causing switching speeds or switching timings of said first PMOS transistor and said first NMOS transistor to differ from switching speeds or switching timings of said second PMOS transistor and said second NMOS transistor, respectively, wherein said means causes switching speeds or switching timings of said second PMOS transistor and said second NMOS transistor to be delayed relative to switching speeds or switching timings of said first PMOS transistor and said first NMOS transistor, respectively, and wherein said means causes channel resistances of said second PMOS transistor and said second NMOS transistor to be greater than channel resistances of said first PMOS transistor and said first NMOS transistor, respectively.

2. A CMOS circuit, comprising:

a first PMOS transistor;

a second PMOS transistor;

a first NMOS transistor;

a second NMOS transistor;

a drain of said second PMOS transistor and a drain of said second NMOS transistor being each connected with a common output terminal, a source of said second PMOS transistor being connected with a drain of said first PMOS transistor, a source of said first PMOS transistor being connected with a power supply voltage.

a source of said second NMOS transistor being connected with a drain of said first NMOS transistor.

a source of said first NMOS transistor being grounded. and means for causing switching speeds or switching timings of said first PMOS transistor and said first NMOS transistor to differ from switching speeds or switching timings of said second PMOS transistor and said second NMOS transistor, respectively, wherein said means causes switching speeds or switching timings of said second PMOS transistor and said second NMOS transistor to be delayed relative to switching speeds or switching timings of said first PMOS transistor and said first NMOS transistor, respectively, and wherein said means causes gate threshold voltages of said second PMOS transistor and said second NMOS transistor to be higher than gate threshold voltages of said first PMOS transistor and said first NMOS transistor, respectively.

3. A CMOS circuit, comprising:

a first PMOS transistor;

a second PMOS transistor;

a first NMOS transistor;

a second NMOS transistor:

a drain of said second PMOS transistor and a drain of said second NMOS transistor being each connected with a common output terminal, a source of said second PMOS transistor being connected with a drain of said first PMOS transistor, a source of said first PMOS transistor being connected with a power supply voltage, a source of said second NMOS transistor being connected with a drain of said first NMOS transistor, a source of said first NMOS transistor being grounded, and means for causing switching speeds or switching timings of said first PMOS transistor and said first NMOS transistor to differ from switching speeds or switching timings of said second PMOS transistor and said second NMOS transistor, respectively, wherein said means causes switching speeds or switching timings of said second PMOS transistor and said second NMOS transistor to be delayed relative to switching speeds or switching timings of said first PMOS transistor and said first NMOS transistor, respectively, and wherein said means causes time constants determined by a gate capacity and a gate resistance of said second PMOS transistor and said second NMOS transistor to be greater than time constants determined by a gate capacity and a gate resistance of said first PMOS transistor and said first NMOS transistor, respectively.

* * * * *